US009713202B2

(12) United States Patent
Broughton et al.

(10) Patent No.: US 9,713,202 B2
(45) Date of Patent: *Jul. 18, 2017

(54) GAS TURBINE PART HAVING AN ELECTRICAL SYSTEM EMBEDDED IN COMPOSITE MATERIAL

(71) Applicant: ROLLS-ROYCE PLC, London (GB)

(72) Inventors: Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 475 days.

This patent is subject to a terminal disclaimer.

(21) Appl. No.: 13/716,503

(22) Filed: Dec. 17, 2012

(65) Prior Publication Data

US 2013/0160462 A1    Jun. 27, 2013

(30) Foreign Application Priority Data

Dec. 22, 2011 (GB) .................................. 1122140.5
Dec. 22, 2011 (GB) .................................. 1122143.9
Mar. 7, 2012 (GB) .................................. 1203991.3

(51) Int. Cl.
*F02C 7/12* (2006.01)
*F02C 7/20* (2006.01)
(Continued)

(52) U.S. Cl.
CPC ................ *H05B 3/28* (2013.01); *B23P 6/005* (2013.01); *B60R 16/00* (2013.01); *B60R 16/02* (2013.01);
(Continued)

(58) Field of Classification Search
CPC ...... F02C 7/12; F02C 7/00; F02C 7/32; F02C 7/20; F02C 7/141; F02C 7/16;
(Continued)

(56) References Cited

U.S. PATENT DOCUMENTS 2,523,083 A    9/1950 Witkowski
2,523,504 A    9/1950 Witkowski
(Continued)

FOREIGN PATENT DOCUMENTS

DE    2941950 B1    2/1981
DE    102009047334 A1    6/2011
(Continued)

OTHER PUBLICATIONS

Apr. 20, 2012 Search Report issued in British Patent Application No. GB1122140.5.
(Continued)

*Primary Examiner* — Carlos A Rivera
(74) *Attorney, Agent, or Firm* — Oliff PLC

(57) ABSTRACT

The present invention provides a gas turbine engine part which has a primary purpose in the engine which is structural and/or aerodynamic. The part is formed of rigid composite material, and has an electrical system comprising electrical conductors permanently embedded in the composite material. This provides advantages in terms of weight, complexity, and build time.

14 Claims, 6 Drawing Sheets

(51) Int. Cl.
| | |
|---|---|
| H05B 3/28 | (2006.01) |
| B23P 6/00 | (2006.01) |
| H02G 3/04 | (2006.01) |
| H01R 12/00 | (2006.01) |
| H02G 3/32 | (2006.01) |
| B60R 16/02 | (2006.01) |
| B64C 3/34 | (2006.01) |
| F02C 7/141 | (2006.01) |
| B60R 16/08 | (2006.01) |
| F02C 7/16 | (2006.01) |
| H01R 12/57 | (2011.01) |
| H01R 12/59 | (2011.01) |
| H01R 12/51 | (2011.01) |
| H01R 12/61 | (2011.01) |
| H02G 3/00 | (2006.01) |
| B60R 16/00 | (2006.01) |
| B64D 29/08 | (2006.01) |
| F02C 7/00 | (2006.01) |
| F02C 7/32 | (2006.01) |
| H02G 1/00 | (2006.01) |
| H02G 3/02 | (2006.01) |
| F02C 7/047 | (2006.01) |
| F02C 7/224 | (2006.01) |
| F24H 1/10 | (2006.01) |
| H05B 1/02 | (2006.01) |
| H05K 7/20 | (2006.01) |

(52) U.S. Cl.
 CPC ...... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *H05K 7/20* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(58) Field of Classification Search
 CPC ........ F02C 7/224; F02C 7/047; Y02T 50/672; Y10T 29/49117; Y10T 29/49234; Y10T 29/49236; Y10T 29/49238; Y10T 29/49002; Y10T 156/10; H05B 3/28; H05B 1/0236; H02G 3/32; H02G 3/02; H02G 3/04; H02G 1/00; B60R 16/08; B60R 16/0215; B60R 16/0207; B64C 3/34; F24H 1/105; H01R 12/00; B23P 6/005
 IPC ...................................................... B23P 6/005
 See application file for complete search history.

(56) References Cited

U.S. PATENT DOCUMENTS

| | | |
|---|---|---|
| 2,866,522 A | 12/1958 | Morley |
| 2,877,544 A | 3/1959 | Gammel |
| 2,963,538 A | 12/1960 | Dahlgren |
| 3,086,071 A | 4/1963 | Preston |
| 3,128,214 A | 4/1964 | Lay |
| 3,168,617 A | 2/1965 | Richter |
| 3,284,003 A | 11/1966 | Ciemochowski |
| 3,494,657 A | 2/1970 | Harper et al. |
| 3,612,744 A | 10/1971 | Thomas |
| 3,700,825 A | 10/1972 | Taplin et al. |
| 3,710,568 A * | 1/1973 | Rice ............ F02C 7/32 439/191 |
| 4,137,888 A | 2/1979 | Allan |
| 4,149,567 A | 4/1979 | Weirich |
| 4,180,608 A | 12/1979 | Del |
| 4,220,912 A | 9/1980 | Williams |
| 4,488,970 A | 12/1984 | Clark |
| 4,533,787 A * | 8/1985 | Anderegg ............ H05K 3/4691 174/117 A |
| 4,652,064 A | 3/1987 | Cetrone |
| 4,671,593 A | 6/1987 | Millon-Fremillon et al. |
| 4,846,405 A | 7/1989 | Zimmermann |
| 5,004,639 A | 4/1991 | Desai |
| 5,012,639 A | 5/1991 | Ream et al. |
| 5,031,396 A | 7/1991 | Margnelli |
| 5,048,747 A | 9/1991 | Clark et al. |
| 5,091,605 A | 2/1992 | Clifford |
| 5,097,390 A * | 3/1992 | Gerrie ................ H05K 3/4691 174/255 |
| 5,138,784 A | 8/1992 | Niwa |
| 5,142,448 A | 8/1992 | Kober et al. |
| 5,174,110 A | 12/1992 | Duesler et al. |
| 5,249,417 A | 10/1993 | Duesler et al. |
| 5,435,124 A | 7/1995 | Sadil et al. |
| 5,509,599 A | 4/1996 | Laue |
| 5,688,145 A | 11/1997 | Liu |
| 5,691,509 A | 11/1997 | Balzano |
| 5,692,909 A | 12/1997 | Gadzinski |
| 5,795,172 A | 8/1998 | Shahriari et al. |
| 5,870,824 A | 2/1999 | Lilja et al. |
| 5,876,013 A | 3/1999 | Ott |
| 5,885,111 A | 3/1999 | Yu |
| 5,895,889 A | 4/1999 | Uchida et al. |
| 6,050,853 A | 4/2000 | Ando et al. |
| 6,148,500 A | 11/2000 | Krone et al. |
| 6,157,542 A | 12/2000 | Wu |
| 6,328,010 B1 | 12/2001 | Thurman |
| 6,344,616 B1 | 2/2002 | Yokokawa |
| 6,399,889 B1 | 6/2002 | Korkowski et al. |
| 6,434,473 B1 | 8/2002 | Hattori |
| 6,481,101 B2 | 11/2002 | Reichinger |
| 6,588,820 B2 | 7/2003 | Rice |
| 6,689,446 B2 | 2/2004 | Barnes et al. |
| 6,702,607 B2 | 3/2004 | Kondo |
| 6,849,805 B2 | 2/2005 | Honda et al. |
| 6,969,807 B1 | 11/2005 | Lin et al. |
| 6,971,650 B2 | 12/2005 | Marelja |
| 6,971,841 B2 | 12/2005 | Care |
| 7,002,269 B2 | 2/2006 | Angerpointer |
| 7,010,906 B2 | 3/2006 | Cazenave et al. |
| 7,232,315 B2 | 6/2007 | Uchida et al. |
| 7,281,318 B2 | 10/2007 | Marshall et al. |
| 7,316,390 B2 | 1/2008 | Burlison |
| 7,389,977 B1 | 6/2008 | Fernandez et al. |
| 7,414,189 B2 | 8/2008 | Griess |
| 7,500,644 B2 | 3/2009 | Naudet et al. |
| 7,506,499 B2 | 3/2009 | Fert et al. |
| 7,516,621 B2 | 4/2009 | Suttie et al. |
| 7,525,816 B2 | 4/2009 | Sawachi |
| 7,543,442 B2 | 6/2009 | Derenes et al. |
| 7,592,546 B2 | 9/2009 | Johansson |
| 7,661,272 B2 | 2/2010 | Gagneux et al. |
| 7,719,378 B2 | 5/2010 | Blair et al. |
| 7,745,730 B2 | 6/2010 | Bailey |
| 7,762,502 B2 * | 7/2010 | Mesing ................ B29C 70/345 248/68.1 |
| 7,837,497 B1 | 11/2010 | Matsuo et al. |
| 7,862,348 B2 | 1/2011 | Strauss |
| 8,038,104 B1 | 10/2011 | Larkin |
| 8,137,524 B2 | 3/2012 | Berggren et al. |
| 8,317,524 B2 | 11/2012 | Bailey |

(56) References Cited

U.S. PATENT DOCUMENTS

| | | | |
|---|---|---|---|
| 8,491,013 B2 | 7/2013 | Peer et al. | |
| 8,522,522 B2 | 9/2013 | Poisson | |
| 8,581,103 B2 | 11/2013 | Aspas Puertolas | |
| 8,794,584 B2 | 8/2014 | Shimada et al. | |
| 8,932,066 B2* | 1/2015 | Broughton | H01R 12/61 439/67 |
| 8,937,254 B2 | 1/2015 | Wen et al. | |
| 9,010,716 B2 | 4/2015 | Kobori | |
| 9,040,821 B2 | 5/2015 | Blanchard et al. | |
| 9,139,144 B2* | 9/2015 | Broughton | H01R 12/61 |
| 9,259,808 B2 | 2/2016 | Broughton et al. | |
| 9,338,830 B2 | 5/2016 | Broughton et al. | |
| 9,456,472 B2 | 9/2016 | Dalton et al. | |
| 2002/0046870 A1 | 4/2002 | Zein et al. | |
| 2002/0084382 A1 | 7/2002 | Crist | |
| 2002/0086586 A1 | 7/2002 | Shi et al. | |
| 2002/0170729 A1 | 11/2002 | Murakami et al. | |
| 2002/0170740 A1 | 11/2002 | Yamanobe et al. | |
| 2003/0095389 A1 | 5/2003 | Samant et al. | |
| 2003/0155467 A1 | 8/2003 | Petrenko | |
| 2003/0183733 A1 | 10/2003 | Pisczak | |
| 2004/0065092 A1* | 4/2004 | Wadia | F01D 25/02 60/778 |
| 2004/0238687 A1 | 12/2004 | Jones et al. | |
| 2004/0266266 A1 | 12/2004 | Lai | |
| 2004/0266274 A1 | 12/2004 | Naudet et al. | |
| 2005/0257956 A1 | 11/2005 | Marshall et al. | |
| 2006/0272340 A1 | 12/2006 | Petrenko | |
| 2006/0278423 A1 | 12/2006 | Ichikawa et al. | |
| 2007/0018057 A1 | 1/2007 | Kovac | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2007/0170312 A1* | 7/2007 | Al-Khalil | B64D 15/22 244/134 A |
| 2007/0234559 A1 | 10/2007 | Tokuda et al. | |
| 2008/0128048 A1 | 6/2008 | Johnson et al. | |
| 2008/0179448 A1* | 7/2008 | Layland | B64D 15/12 244/1 N |
| 2008/0185478 A1 | 8/2008 | Dannenberg | |
| 2008/0245932 A1 | 10/2008 | Prellwitz et al. | |
| 2009/0067979 A1* | 3/2009 | Braley | F01D 21/045 415/9 |
| 2009/0072091 A1* | 3/2009 | Al-Khalil | B64D 15/22 244/134 A |
| 2009/0095842 A1 | 4/2009 | Gaertner, II et al. | |
| 2009/0134272 A1 | 5/2009 | Vauchel | |
| 2009/0175718 A1 | 7/2009 | Diaz et al. | |
| 2009/0189051 A1 | 7/2009 | Love | |
| 2009/0230650 A1 | 9/2009 | Mayen et al. | |
| 2009/0242703 A1* | 10/2009 | Alexander | F02C 7/047 244/134 D |
| 2009/0277578 A1 | 11/2009 | Sung et al. | |
| 2009/0289232 A1* | 11/2009 | Rice | H01B 1/24 252/511 |
| 2010/0162726 A1 | 7/2010 | Robertson et al. | |
| 2010/0261365 A1 | 10/2010 | Sakakura | |
| 2010/0293987 A1 | 11/2010 | Horst et al. | |
| 2010/0308169 A1 | 12/2010 | Blanchard et al. | |
| 2011/0011627 A1 | 1/2011 | Aspas Puertolas | |
| 2011/0014803 A1* | 1/2011 | Bailey | H01R 12/616 439/77 |
| 2011/0016882 A1* | 1/2011 | Woelke | F02C 7/00 60/796 |
| 2011/0017879 A1* | 1/2011 | Woelke | F16L 3/085 248/69 |
| 2011/0053468 A1* | 3/2011 | Vontell | B24B 57/02 451/53 |
| 2011/0056961 A1 | 3/2011 | Amtmann et al. | |
| 2011/0111616 A1 | 5/2011 | Chang et al. | |
| 2011/0120748 A1 | 5/2011 | Bailey | |
| 2011/0236182 A1 | 9/2011 | Wiebe et al. | |
| 2011/0271655 A1 | 11/2011 | Poisson | |
| 2011/0315830 A1 | 12/2011 | Eshima et al. | |
| 2012/0012710 A1 | 1/2012 | Yamaguchi et al. | |
| 2012/0103685 A1 | 5/2012 | Blanchard et al. | |
| 2012/0111614 A1 | 5/2012 | Free | |
| 2012/0312022 A1 | 12/2012 | Lam et al. | |
| 2013/0048344 A1 | 2/2013 | Lou | |
| 2013/0092434 A1 | 4/2013 | Kato et al. | |
| 2013/0160458 A1 | 6/2013 | Willmot et al. | |
| 2013/0160460 A1 | 6/2013 | Dalton et al. | |
| 2013/0160464 A1 | 6/2013 | Maszczk et al. | |
| 2013/0189868 A1 | 7/2013 | Fitt et al. | |
| 2013/0316147 A1 | 11/2013 | Douglas et al. | |
| 2014/0208712 A1 | 7/2014 | Dowdell | |
| 2014/0208770 A1 | 7/2014 | Fitt et al. | |
| 2014/0290271 A1 | 10/2014 | Dalton | |
| 2014/0305134 A1 | 10/2014 | Amarasinghe et al. | |
| 2014/0305136 A1 | 10/2014 | Taylor | |
| 2014/0325992 A1 | 11/2014 | Summerfield | |
| 2014/0325993 A1 | 11/2014 | Broughton et al. | |
| 2014/0325994 A1 | 11/2014 | Dowdell et al. | |
| 2014/0326058 A1 | 11/2014 | Broughton | |
| 2014/0327299 A1 | 11/2014 | Broughton et al. | |
| 2014/0328030 A1 | 11/2014 | Broughton | |
| 2015/0342022 A1 | 11/2015 | Willmot et al. | |
| 2016/0056578 A1 | 2/2016 | Taylor | |
| 2016/0057873 A1 | 2/2016 | Richardson et al. | |
| 2016/0069213 A1 | 3/2016 | Fitt et al. | |
| 2016/0072210 A1 | 3/2016 | Armstrong et al. | |
| 2016/0096288 A1 | 4/2016 | Dowdell | |

FOREIGN PATENT DOCUMENTS

| | | |
|---|---|---|
| EP | 1741879 A1 | 1/2007 |
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 2009/118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Apr. 19, 2012 Search Report issued in British Patent Application No. GB1122143.9.

Jun. 21, 2012 Search Report issued in British Patent Application No. GB1203991.3.

Jul. 31, 2012 Search Report issued in British Patent Application No. GB 1207733.5.

Aug. 7, 2012 Search Report issued in British Patent Application No. GB1207735.0.

Oct. 23, 2012 Search Report issued in British Patent Application No. GB1212221.4.

Nov. 7, 2012 Search Report issued in British Patent Application No. GB1212223.0.

Broughton et al., Pending U.S. Appl. No. 13/716,648, filed Dec. 17, 2012.

Broughton et al., Pending U.S. Appl. No. 13/716,439, filed Dec. 17, 2012.

Broughton et al., Pending U.S. Appl. No. 13/716,254, filed Dec. 17, 2012.

Willmot et al., Pending U.S. Appl. No. 13/716,300, filed Dec. 17, 2012.

Willmot et al., Pending U.S. Appl. No. 13/716,239, filed Dec. 17, 2012.

Broughton et al., Pending U.S. Appl. No. 13/716,587, filed Dec. 17, 2012.

(56) References Cited

OTHER PUBLICATIONS

Maszczk et al., Pending U.S. Appl. No. 13/716,796, filed Dec. 17, 2012.
Broughton et al., Pending U.S. Appl. No. 13/716,497, filed Dec. 17, 2012.
Broughton et al., Pending U.S. Appl. No. 13/716,808, filed Dec. 17, 2012.
Dalton et al., Pending U.S. Appl. No. 13/716,244, filed Dec. 17, 2012.
Broughton et al., Pending U.S. Appl. No. 13/716,708, filed Dec. 17, 2012.
Broughton et al., Pending U.S. Appl. No. 13/716,516, filed Dec. 17, 2012.
Fitt et al., Pending U.S. Appl. No. 13/792,851, filed Mar. 11, 2013.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Aug. 15, 2014 Office Action issued in U.S. Appl. No. 13/716,497.
Nov. 10, 2014 Office Action issued in U.S. Appl. No. 13/716,300.
Nov. 20, 2014 Office Action issued in U.S. Appl. No. 13/716,648.
Feb. 25, 2015 Office Action issued in U.S. Appl. No. 13/716,497.
Mar. 11, 2015 Office Action issued in U.S. Appl. No. 13/716,300.
Jun. 19, 2015 Office Action issued in U.S. Appl. No. 13/716,244.
Jun. 5, 2015 Office Action issued in U.S. Appl. No. 13/716,708.
Nellis and Klein, "Heat Transfer", 2009, Campbridge University pp. 748-751.
Jun. 12, 2015 Office Action issued in U.S. Appl. No. 13/716,254.
Jul. 17, 2015 Office Action issued in U.S. Appl. No. 13/716,497.
Jul. 29, 2015 Office Action issued in U.S. Appl. No. 13/716,648.
Jul. 28, 2015 Office Action issued in U.S. Appl. No. 13/716,796.
Apr. 6, 2015 Office Action issued in U.S. Appl. No. 13/716,648.
Oct. 29, 2015 Office Action issued in Chinese Application No. 201210599254.0.
Aug. 14, 2015 Office Action issued in U.S. Appl. No. 13/716,239.
Aug. 13, 2015 Office Action issued in U.S. Appl. No. 13/716,516.
Dec. 1, 2015 Office Action issued in U.S. Appl. No. 13/716,808.
Oct. 7, 2015 Office Action issued in U.S. Appl. No. 13/716,587.
Sep. 23, 2015 Office Action issued in U.S. Appl. No. 13/716,439.
Aug. 27, 2015 Office Action issued in U.S. Appl. No. 13/792,851.
Apr. 22, 2016 Office Action issued in U.S. Appl. No. 14/100,745.
Apr. 22, 2016 Office Action issued in U.S. Appl. No. 13/716,808.
Apr. 7, 2016 Office Action issued in U.S. Appl. No. 13/716,587.
Apr. 8, 2016 Office Action issued in U.S. Appl. No. 13/716,497.
Sep. 23, 2016 Office Action Issued in U.S. Appl. No. 13/716,497.
Aug. 11, 2016 Office Action Issued in U.S. Appl. No. 13/716,808.
Oct. 28, 2016 Office Action issued in U.S. Appl. No. 14/100,745.
Translation of Oct. 12, 2016 Office Action issued in Russian Patent Application No. 2012154565.
Sep. 15, 2016 Office Action issued in U.S. Appl. No. 13/716,587.
Feb. 2, 2017 Office Action issued in U.S. Appl. No. 13/716,587.
Apr. 10, 2017 Search Report issued in European Patent Application No. 12197394.
Jan. 20, 2017 Office Action issued in U.S. Appl. No. 13/716,808.

* cited by examiner

GAS TURBINE PART HAVING AN ELECTRICAL SYSTEM EMBEDDED IN COMPOSITE MATERIAL

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, and British Patent Application Number 1203991.3 filed 7 Mar. 2012, the entire contents of all of which are incorporated by reference.

BACKGROUND OF THE INVENTION

1. Field of the Invention

The present invention relates to a gas turbine engine part which is formed of composite material, and has electrical conductors in the composite material.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY OF THE INVENTION

Thus, in place of a conventional harness, it may be desirable to provide an electrical rigid raft, formed from composite material, in which an electrical system comprising electrical conductors is embedded in the composite material. The electrical conductors can transmit engine measurement or control signals to or from electrical components and/or convey electrical power to electrical components. Transferring electrical signals or power using the embedded electrical system can provide a number of advantages over transferring electrical signals or power using a conventional harness. For example, during assembly and in use, the raft may provide greater protection to its electrical conductors than a conventional harness. Further, the use of the raft may significantly reduce the build and maintenance times of an engine, and/or reduce the possibility of errors occurring during such procedures. The raft can also provide weight and size advantages over conventional harnesses. The raft may have a fluid system embedded in the composite material, and similar advantages can accrue to the raft in relation to the optional fluid system.

However, the present invention is at least partly based on a realisation that it is possible to obtain further advantages by integrating such a raft into an existing engine structure.

Thus, in a first aspect, the present invention provides a gas turbine engine part which has a primary purpose in the engine which is structural and/or aerodynamic, the part being formed of rigid composite material, and having an electrical system comprising electrical conductors permanently embedded in the composite material. Optionally, the part also has a fluid system permanently embedded in the composite material.

The advantages of a raft relative to a conventional harness can accrue equally to such a part relative to a conventional harness. However, in addition, by combining rigid electrical raft functionality with the primary structural and/or aerodynamic purpose of the part, it is possible to avoid providing a rigid electrical raft as a separate item. This can remove a need for mounting structures for mounting such a separate raft to the engine, leading to further weight-savings and possibly space- and cost-savings, and further reduced engine assembly and disassembly times.

In a second aspect, the present invention provides a gas turbine engine or gas turbine engine installation including the part according to the first aspect. A flexible cable may electrically connect between the electrical conductors and an electrical component of the engine, which may be mounted to the part.

In a third aspect, the present invention provides a method of producing the part according to the first aspect, the method including:

laying up layers of reinforcing fibre and resin, with the electrical conductors being sandwiched between at least some of the layers; and consolidating the layers (e.g. by moulding or pressing while heating) to form the part. When the part also has a fluid system permanently embedded in the composite material, the method may also include sandwiching fluid carrying pipes of the fluid system between at least some of the layers.

Further optional features of the invention will now be set out. These are applicable singly or in any combination with any aspect of the invention.

The composite material can be a fibre reinforced polymer matrix material. The fibres may be continuous fibres. The polymer matrix may be a suitable resin.

The engine can be a turbofan.

The part may be a nacelle, or a part thereof. Such a nacelle may provide a streamlined outer surface of the engine.

The part may be a portion of a core engine casing that surrounds the core engine. In a turbofan, such a portion may be a core fairing which provides an inner surface of the bypass duct of the engine.

When the engine is a turbofan, the part may be a fan casing that forms an outer surface of the bypass duct of the engine and/or contains an engine fan blade in case of a blade off event.

When the engine is a turbofan, the part may be radially extending splitter (an aerodynamic fairing which may be referred to as a bifurcation) that extends across the bypass flow duct.

When the engine is a turbofan, the part may be an A-frame that extends between the fan casing and core casing to provide the engine with structural rigidity.

The part may be a stationary shroud that contains a drive shaft that runs between an internal gearbox mounted on a core of the engine and an accessory gearbox. Typically, in a turbofan engine for example, the accessory gearbox is on the fan casing and the drive shaft (and thus shroud) is radially extending.

Conveniently, the part may be formed by laying up layers of reinforcing fibre and resin, the electrical conductors (and optionally fluid carrying pipes of the fluid system) being sandwiched between at least some of the layers during the laying up process, and then consolidating the layers.

The part may further have an electrical connector that is in electrical contact with one or more of the electrical conductors, and can be connected to a corresponding connector of an electrical component of the engine. The electrical connector may also be permanently embedded in the composite material (e.g. during a laying up process). Such an electrical component may be an electronic control unit (ECU), for example an electronic engine controller (EEC) or an engine health monitoring unit (EMU). The part may have the electrical component mounted thereto.

Next, we describe below optional features of electrical rafts/electrical raft assemblies. It is to be understood that, to the extent that the part of the present invention integrates an electrical rigid raft into an existing engine structure, these features pertain also to the part of the present invention.

In general, the use of one or more electrical rafts/electrical raft assemblies may significantly reduce build time of an engine. For example, use of electrical rafts/electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Thus, use of electrical raft assemblies in a gas turbine installation may reduce assembly time and/or reduce the possibility of errors occurring during assembly.

Use of electrical raft assemblies may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft assembly from the gas turbine engine, the rigid raft assembly incorporating at least a part of at least one component or system of the gas turbine engine; and installing a second, pre-prepared, rigid raft assembly onto the gas turbine engine in place of the first raft assembly. The first and second rigid raft assemblies may be electrical raft assemblies having electrical conductors embedded in a rigid material. The electrical conductors may be at least a part of an electrical system arranged to transfer electrical signals around the engine.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. Indeed, as mentioned above, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Any suitable material may be used for the rigid material of the electrical raft. For example, the rigid material may be a rigid composite material, such as an organic matrix composite material. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve.

At least some (for example a plurality) of the electrical conductors may be provided in a flexible printed circuit (FPC). Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

The electrical raft (or electrical raft assembly) may be at least a part of an electrical harness for a gas turbine engine, and thus may be referred to herein as an electrical harness raft (or electrical harness raft assembly).

An electrical raft (or electrical raft assembly) may comprise a fluid passage. Such a fluid passage may be embedded therein and/or otherwise provided thereto. The fluid passage may be part of a fluid system, such as a gas (for example pneumatic or cooling gas/air) and/or liquid (for example a fuel, hydraulic and/or lubricant liquid).

There is also provided a method of assembling an electrical raft assembly and/or a gas turbine engine. The method comprises preparing an electrical raft assembly as described above and elsewhere herein. The method also comprises electrically and mechanically connecting the prepared electrical raft assembly to the rest of the apparatus/gas turbine engine.

Thus, there is provided a gas turbine engine or gas turbine engine installation (for example for an airframe) comprising an electrical raft and/or an electrical raft assembly as described above and elsewhere herein. For example, at least one electrical raft and/or electrical raft assembly may be used as part of an electrical harness for transferring electrical signals around the engine, in the form of electrical harness raft(s) and/or electrical harness raft assemblies.

The electrical raft may comprise one or more electrical connectors or sockets, which may be electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft.

The electrical raft assembly may be a first engine installation component, and the gas turbine engine may further comprise a second engine installation component having electrical conductors. The gas turbine engine may further comprise at least one flexible cable connected between the electrical raft assembly and the second engine installation component so as to electrically connect electrical conductors of the electrical raft assembly with electrical conductors of the second engine installation component.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

Other components/systems of a gas turbine engine may be provided to an electrical raft assembly in any suitable manner. For example, such other components/systems may be mounted on one or more electrical raft assemblies. Thus, a surface of an electrical harness raft may be used as a mounting surface for other gas turbine engine components/systems, such as ancillary/auxiliary components/systems.

For example, an electrical unit may be mounted on an electrical raft. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft. Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. More than one set of fluid pipes, for example for carrying different or the same fluids, may be mounted on the same electrical raft.

An anti-vibration mount may be used to attach an electrical raft to another component, thereby allowing the electrical raft to be vibration isolated (or at least substantially vibration isolated). Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
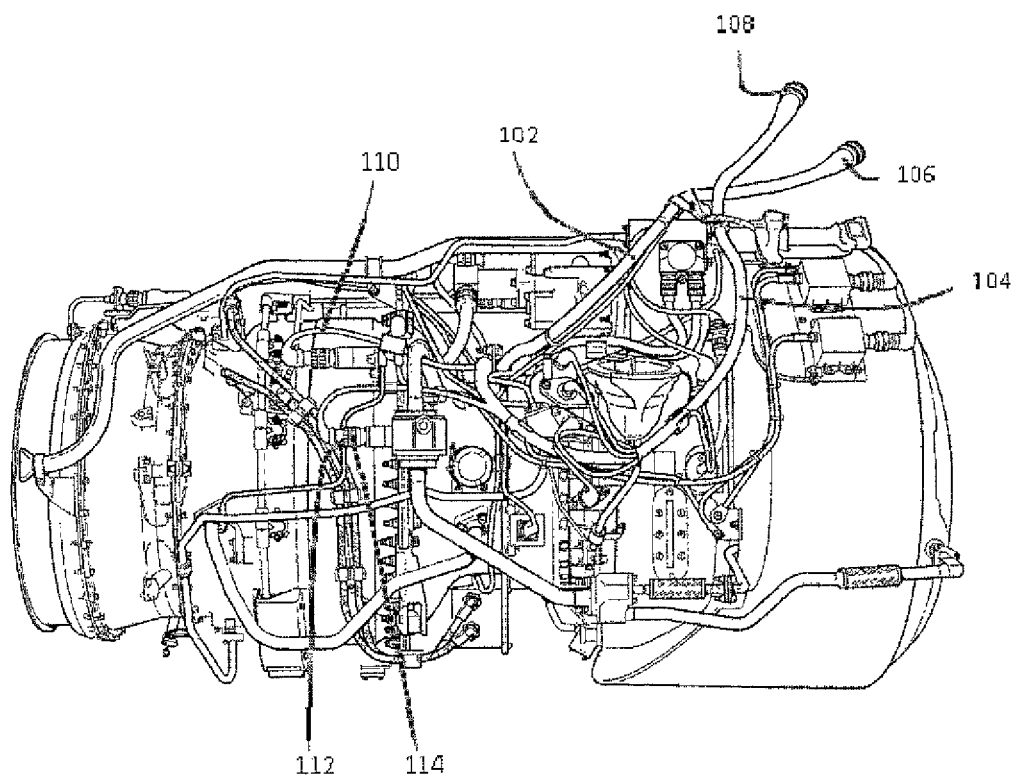
FIG. 1 shows a gas turbine engine with a conventional harness.
Figure 2:
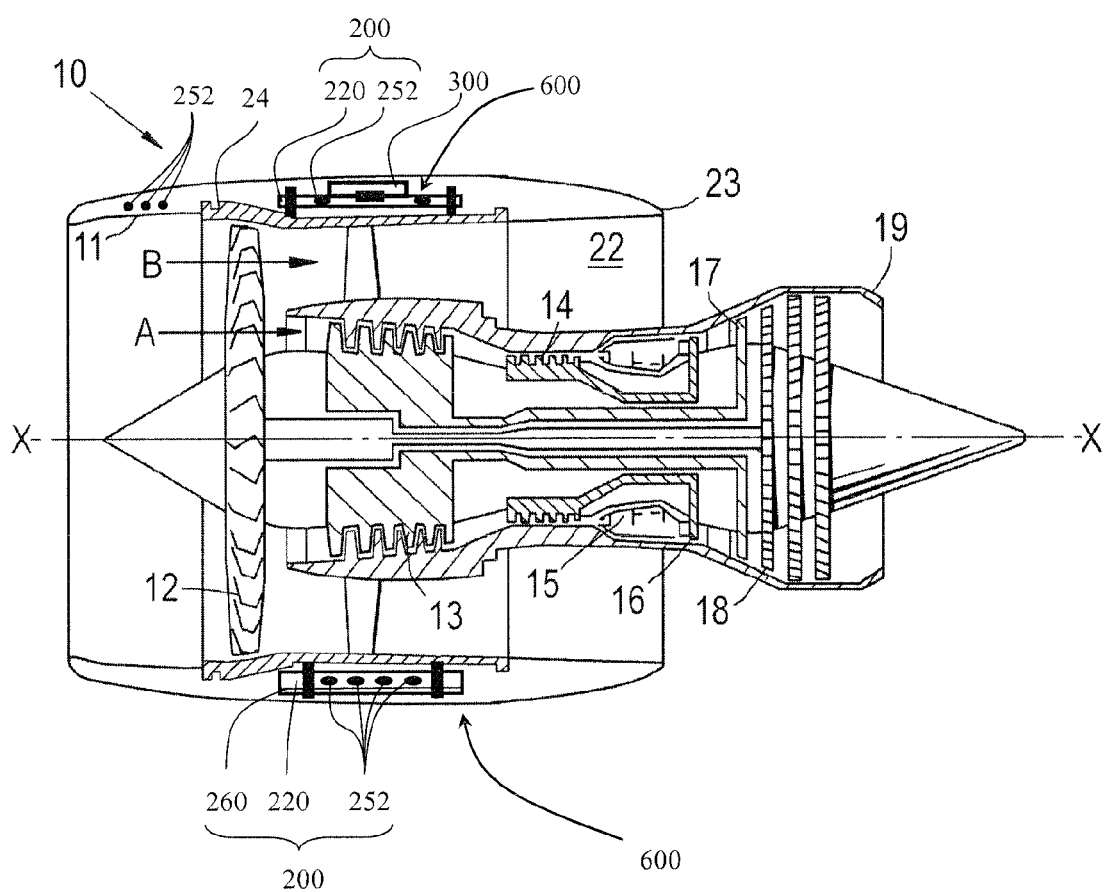
FIG. 2 shows a cross-section through a gas turbine engine having electrical raft assemblies.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical raft assemblies 600. Each electrical raft assembly 600 comprises an electrical raft 200. The electrical rafts 200 may be used to transmit/transfer electrical signals (or electricity, including electrical power and/or electrical control signals) around the engine and/or to/from the engine 10 from other components, such as components of an airframe. The function and/or construction of each electrical raft 200 and electrical raft assembly 600 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material.

FIG. 2 also shows electrical conductors 252 embedded directly into the nacelle, which may be a composite structure.

The electrical conductors 252 in the electrical raft 200 may be provided in a harness 250, which may be a flexible printed circuit board (or FPC) 250.

Figure 3:
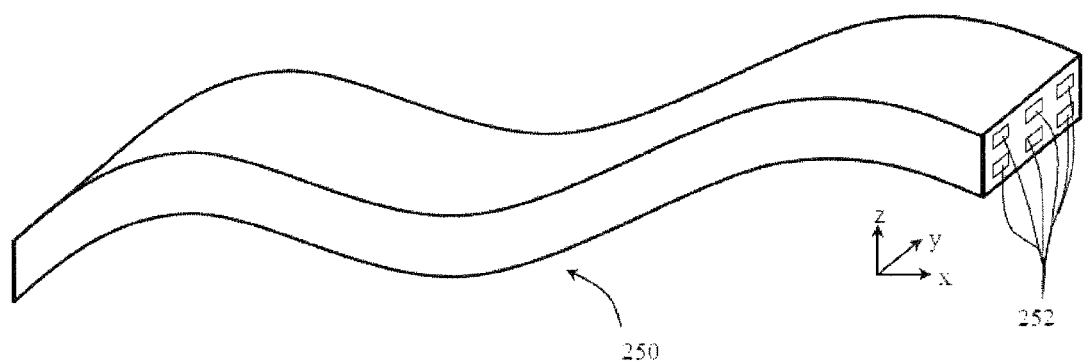
FIG. 3 shows a perspective view of a flexible printed circuit.
Figure 4:
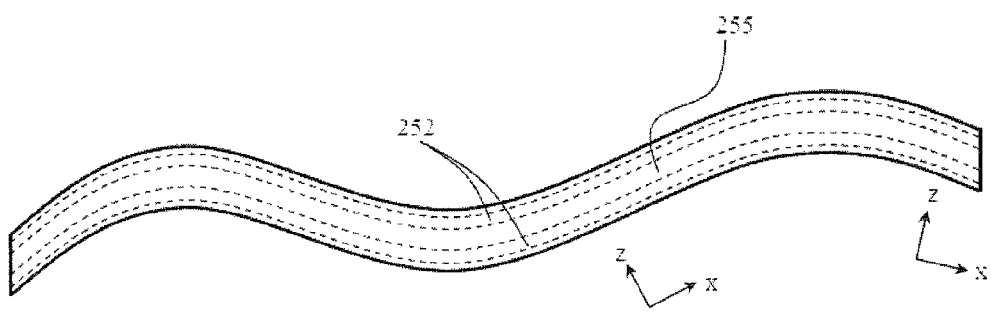
FIG. 4 shows a side view of the flexible printed circuit of FIG. 3.

An example of an FPC 250 in which the electrical conductors 252 may be provided is shown in greater detail in FIGS. 3 and 4. FIG. 3 shows a perspective view of the FPC 250, and FIG. 4 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 3 and 4, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 4. The x-y surface(s) (i.e. the surfaces formed by the x and y directions) may be said to be the major surface(s) of the FPC 250. In the example shown in FIGS. 3 and 4, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 3 and 4 has six conductive tracks 252 running through the substrate 255. However, the number of conductive tracks 252 running through a substrate 255 could be fewer than six, or greater than six, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 3 and 4 comprises 2 layers of tracks, with each layer comprising 3 tracks 252.

An electrical raft 200 may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 5:
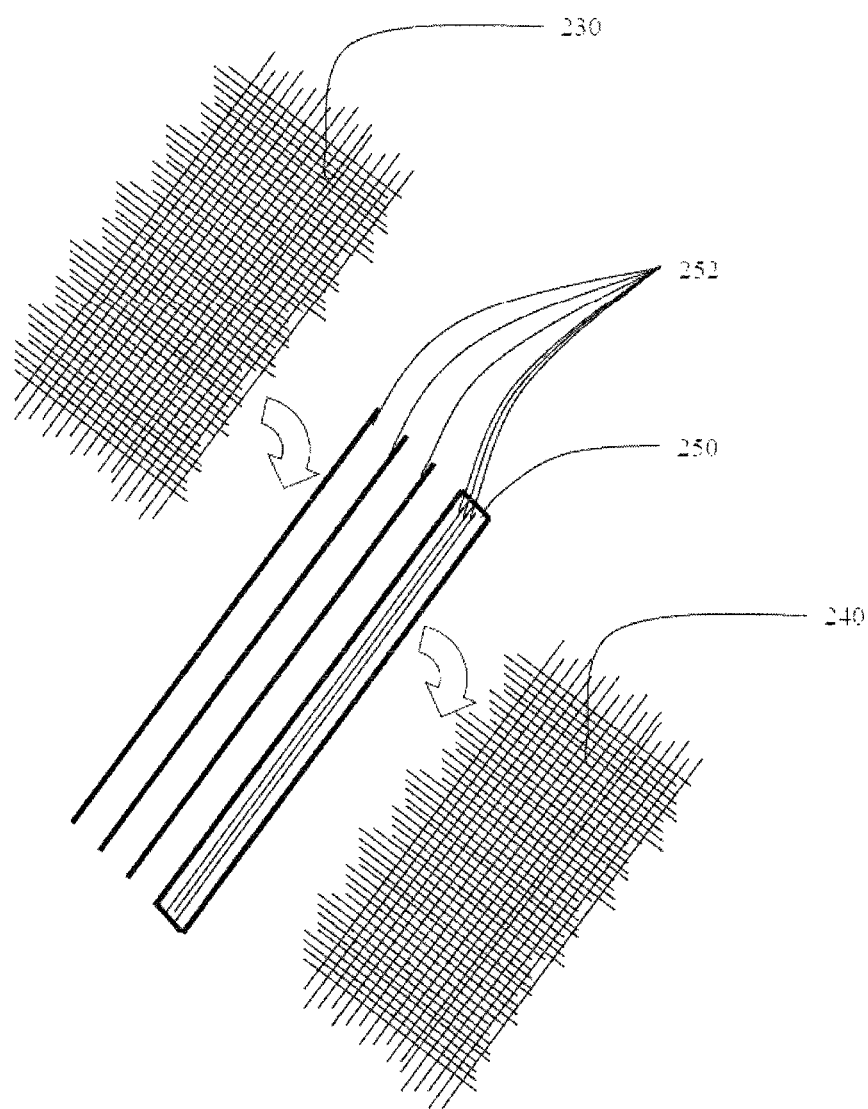
FIG. 5 shows a schematic of an electrical raft prior to assembly.

FIG. 5 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 5, the fibre and resin compound is formed of a sheet of interwoven fibres, or strands. The strands in FIG. 5 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. In some constructions no fibre may be used at all in the rigid material 220.

The electrical raft 200 could be, for example, any gas turbine engine part which has a primary purpose in the engine which is structural and/or aerodynamic. Thus, any suitable method, such as those described above, may be used to manufacture such an engine part having electrical conductors permanently embedded in the composite material.

Figure 6:
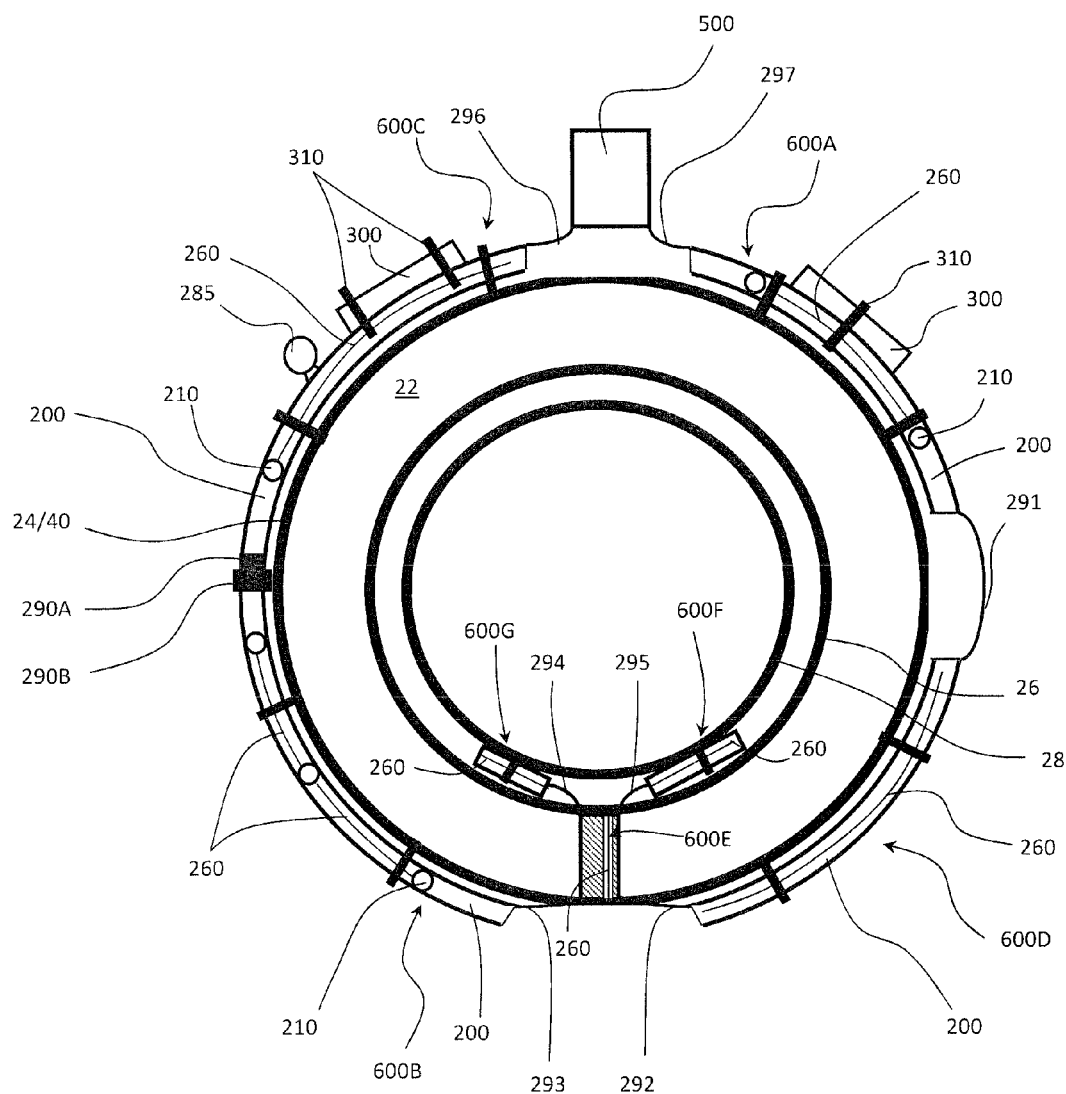
FIG. 6 shows a cross-section normal to the axial direction through a gas turbine engine having electrical raft assemblies.

FIG. 6 is a schematic showing a cross-section perpendicular to the direction X-X of a gas turbine engine comprising electrical raft assemblies 600A-600G. Any one of the electrical raft assemblies 600A-600G may comprise any or all of the features of an electrical raft assembly 600 as described above, for example. Thus, for example, any one of the electrical raft assemblies may comprise an electrical raft 200 (not labelled for raft assemblies 600E-600G for simplicity only) having electrical conductors 252 (not labelled in FIG. 6 for simplicity only) embedded therein. Some or all of the electrical raft assemblies 600A-600G (which may collectively be referred to as electrical raft assemblies 600) comprise a mounting fixture for attaching the respective assembly 600 to a mounting structure.

The mounting structure is part of a fan case 24 for electrical raft assemblies 600A-600D, part of a bifurcation splitter that radially crosses a bypass duct 22 for electrical raft assemblies 600E and part of an engine core case 28 for electrical raft assemblies 600F and 600G. However, it will be appreciated that an electrical raft assembly 600 could be mounted in any suitable and/or desired location on a gas turbine engine.

In FIG. 6, two electrical raft assemblies 600A, 600C are shown as having an electrical unit 300 mounted on the respective electrical raft 200. However, any (or none) of the electrical raft assemblies 600A-600G may have an electrical unit 300 mounted to the respective electrical raft 200.

As mentioned herein, each of the electrical rafts 200 associated with the electrical raft assemblies 600A-600G shown in FIG. 6 comprises one or more electrical conductors 252 embedded therein. However, any one or more of the electrical rafts 200 may be replaced with a raft that does not comprise electrical conductors 252. Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine may have a combination of electrical rafts 200 and non-electrical rafts.

The arrangement of electrical raft assemblies 600A-600G shown in FIG. 6 is by way of example only. Alternative arrangements, for example in terms of number, size, shape and/or positioning, of electrical raft assemblies 600A-600G may be used. For example, there need not be seven electrical raft assemblies, the assemblies may or may not be connected together, and the rafts could be provided to (for example mounted on) any one or more components of the gas turbine engine. Purely by way of example only, connection between electrical raft assemblies 600A-600D mounted on the fan casing 24 to the electrical raft assemblies 600F, 600G mounted on the core casing 28 may be provided at least in part by means other than an additional electrical raft assembly 600E, for example using wire conductors with insulating sleeves. By way of further example, one or more electrical raft assemblies 600 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts of the electrical raft assemblies 600A-600G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 6 example, three of the electrical rafts (of electrical raft assemblies 600A, 600B, 600C) comprise a fluid passage 210 at least partially embedded therein. The electrical raft of assembly 600C also has a fluid passage 285 (which may be for any fluid, such as those listed above in relation to embedded passage 210) mounted thereon. Such a mounted fluid passage 285 may be provided to any electrical raft, such as those of electrical raft assemblies 600A-600G shown in FIG. 6. The fluid passages 210, 285 shown in FIG. 6 may be oriented in an axial direction of the engine 10. However, fluid passages may be oriented in any direction, for example axial, radial, circumferential or a combination thereof.

An electrical raft 200, including composite gas turbine engine parts which have a primary purpose in the engine which is structural and/or aerodynamic and having electrical conductors permanently embedded in the composite material, may comprise an electrically conductive grounding or screen layer 260, as shown in the electrical rafts 200 shown in FIG. 6. However, it will be appreciated that electrical rafts/parts according to the invention and/or for use with the invention need not have such an electrically conductive grounding or screen layer 260. Where an electrically conductive grounding or screen layer 260 is present, an electrically conductive fastener 310 may be used to fasten, or fix, the electrical unit 300 (where present) to the electrical raft 200. This may allow the electrical unit 300 to be electrically grounded. It will also be appreciated, however, that electrical rafts 200 according to the invention and/or for use with the invention need not have such an electrically conductive fastener 310.

Any of the electrical raft assemblies 600A-600G (or the respective electrical rafts 200 thereof) may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 6, and described below, but other connectors may be used. For example, electrical raft assemblies 600 (and/or non-electrical rafts) may be connected together (or to other components) using any combination of electrical, fluid and/or mechanical connectors. Thus, any of the connections 290A/290B, 291-297 shown in FIG. 6 may be any combination of electrical, fluid and/or mechanical connection. Alternatively, electrical raft assemblies 600 (and/or non-electrical rafts) may be standalone, and thus may have no connection to other rafts or components.

A connection 291 is shown between the electrical rafts of the assemblies 600A and 600D. The connection 291 may comprise an electrical connection. Such an electrical connection may be flexible and may, for example, take the form of a flexible printed circuit such as the flexible printed circuit 250 shown in FIGS. 3 and 4. Such a flexible electrical connection may be used to electrically connect any electrical raft assembly 600 to any other component, such as another electrical raft assembly 600. A connection 297 (which may be or comprise an electrical connection) is provided between the electrical raft of the assembly 600A and a part of an airframe, or airframe installation 500, which may, for example, be a pylon. Similarly, a fluid and/or mechanical connection 296 may additionally or alternatively be provided between the airframe 500 and another electrical raft of the assembly 600C. As shown in FIG. 6, other electrical and/or fluid connections 292, 293, 294, 295 may be provided between electrical rafts 200 (or assemblies 600) and other components, such as other electrical rafts 200 (or assemblies 600).

A direct connection 290A, 290E may be provided, as shown for example between the electrical rafts of the assemblies 600B and 600C in the FIG. 6 arrangement. Such a direct connection 290A, 290B may comprise a connector 290A provided on (for example embedded in) one electrical raft 200 connected to a complimentary connector 290B provided on (for example embedded in) another electrical raft 200. Such a direct connection 290A, 290B may, for example, provide fluid and/or electrical connection between the two electrical rafts assemblies 600B, 600C.

It will be appreciated that there are many alternative configurations and/or arrangements of electrical raft assemblies 600 and gas turbine engines 10 comprising electrical raft assemblies 600 other than those described herein. For example, alternative arrangements of electrical raft assemblies 600 (for example in terms of the arrangement, including number/shape/positioning/constructions, of mounting fixtures, the arrangement/shape/positioning/construction of the electrical rafts 200, the type and/or positioning of components (if any) mounted to/embedded in the electrical rafts 200, the rigid material 220 and the electrical conductors 252) may be readily apparent to the skilled person from the disclosure provided herein. As mentioned herein, the electrical rafts 200 may be gas turbine engine parts that have a primary purpose as an aerodynamic and/or structural part. Alternative arrangements of connections (for example mechanical, electrical and/or fluid) between the electrical (or non-electrical) rafts and/or raft assemblies and between the electrical (or non-electrical) rafts or raft assemblies and other components may be readily apparent to the skilled person from the disclosure provided herein. Furthermore, any feature described and/or claimed herein may be combined with any other compatible feature.

Figure 7:
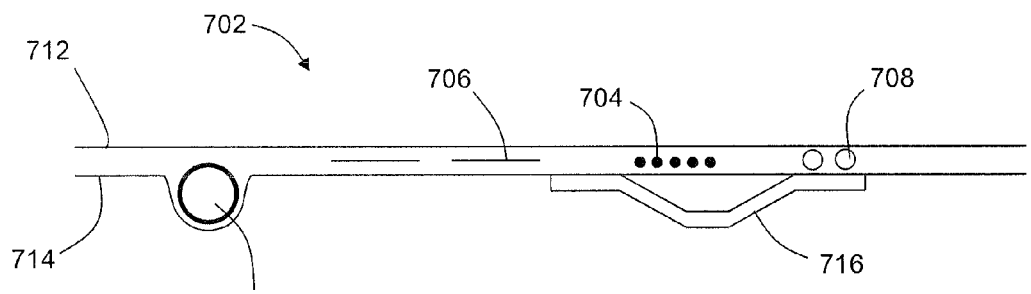
FIG. 7 shows schematically a cross-sectional view of a portion of a nacelle in accordance with the present invention, the nacelle having an electrical system and a fluid system permanently embedded therein.

FIG. 7 shows schematically a cross-sectional view of a portion of a nacelle 702 in accordance with the present invention for surrounding a gas turbine engine, the nacelle having an electrical system and a fluid system permanently embedded therein. The electrical system comprises conductive wires or ribbons 704 and PCBs 706. The fluid system comprises small diameter fluid-carrying tubes 708 and large diameter fluid-carrying tubes 710. The outer surface 712 of the nacelle is exposed to an external air flow and is therefore generally smooth and streamlined. The inner surface 714 of the nacelle is not exposed to an external air flow in the same way, and can thus have features, such as the larger tubes 710 and stiffeners 716, protruding therefrom.

The nacelle 702 is formed by laying up layers of continuous fibre reinforcement and resin as described above. The wires or ribbons 704 and PCBs 706 and the tubes 710, 712 are sandwiched between these layers during the laying up process. The layers are then consolidated (e.g. by heating and moulding) to permanently embed the electrical and fluid systems in the nacelle. Thus, although the nacelle 702 has a primary aerodynamic purpose, it also forms a rigid electrical raft which allows electrical signals (and also in this case fluids) to be transported about the engine. This dual function makes it possible to avoid the installation of separate electrical raft(s), removing a need for raft mounting structures, and leading to weight-, space- and cost-savings, and reduced engine assembly and disassembly times.

Figure 8:
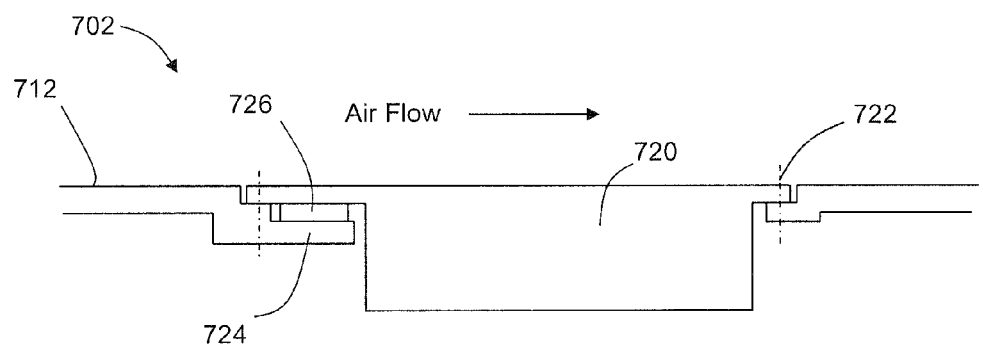
FIG. 8 shows a schematically a cross-sectional view of a portion of the nacelle of FIG. 7 and a fan or core casing.

FIG. 8 shows schematically a cross-sectional view of a portion of the nacelle 702 and a fan or core casing 718. The nacelle has an aperture formed therein into which an electrical component 720, such as an ECU, can be mounted and held in place by mechanical fixings 722. The outer surface of the electrical component can be flush with the outer surface 712 of the nacelle to preserve its streamlined finish. The nacelle has an electrical connector 724 permanently embedded therein (e.g. during the laying up process) and electrically connected to its electrical system. The electrical component has a corresponding connector 726, which engages with the connector 724 to electrically join the component to the electrical system. In this way, the component can receive electrical power and receive and/or transmit electrical signals via the nacelle. In a similar fashion, the nacelle can have permanently embedded fluid connectors (not shown) for joining to its fluid system.

Figure 9:
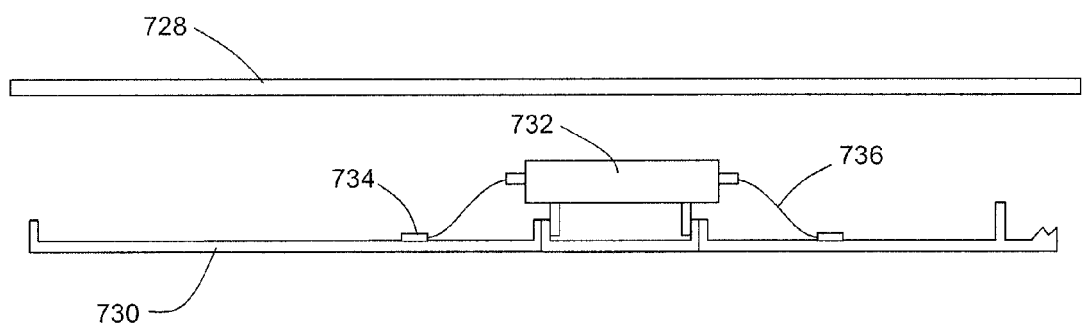
FIG. 9 shows a schematically a cross-sectional view of a portion of a further nacelle and a further fan or core casing in accordance with the present invention.

FIG. 9 shows a schematically a cross-sectional view of a portion of a further nacelle 728 and a further fan or core casing 730 in accordance with the present invention. In this case, rather than having the electrical and fluid systems embedded in the nacelle, they are permanently embedded in the casing (but not explicitly shown in FIG. 9 for clarity). A further electrical component 732 is shown mounted to the outer side of the casing. The component is joined to the electrical system by electrical connectors 734 embedded in the casing and by flexible cables 736 running between these connectors and the electrical component.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical raft assemblies 600 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

We claim:

1. A gas turbine engine part, comprising:
a composite material entirely composed from resin and reinforcing fibers, and
an electrical system comprising metallic electrical conductors permanently embedded in the composite material forming the gas engine turbine part so as to be surrounded by and fixed in position by the composite material, wherein
the composite material that surrounds and fixes the electrical conductors is the same as the composite material of the rest of the gas turbine engine part,
the gas turbine engine part includes at least one surface that (i) forms a part of an outer surface of a turbofan gas turbine engine, or (ii) is in contact with a bypass flow of the turbofan gas turbine engine in use, and
the electrical system forms part of an electrical harness of the turbofan gas turbine engine.

2. The gas turbine engine part according to claim 1, wherein the gas turbine engine part is a nacelle that provides a streamlined outer surface of the turbofan gas turbine engine.

3. The gas turbine engine part according to claim 1, wherein the gas turbine engine part is a core engine casing that surrounds a core engine.

4. The gas turbine engine part according to claim 1, wherein the gas turbine engine part is a fan casing that forms an outer surface of a bypass duct in the turbofan gas turbine engine and contains an engine fan blade in case of a blade off event.

5. The gas turbine engine part according to claim 1, wherein the gas turbine engine part is an aerodynamic, radially extending splitter that in use extends across a bypass flow duct of the turbofan gas turbine engine.

6. The gas turbine engine part according to claim 1, wherein the gas turbine engine part is an A-frame that in use extends between a fan casing and a core casing of the turbofan gas turbine engine to provide the turbofan gas turbine engine with structural rigidity.

7. The gas turbine engine part according to claim 1, further comprising a fluid system permanently embedded in the composite material.

8. The gas turbine engine part according to claim 1, further comprising an electrical connector permanently embedded therein that is in electrical contact with at least one of the electrical conductors, and is connectable to a corresponding connector of an electrical component of the turbofan gas turbine engine.

9. A gas turbine engine or gas turbine engine installation including the gas turbine engine part according to claim 1.

10. The gas turbine engine or gas turbine engine installation according to claim 9, wherein a flexible cable electrically connects between the electrical conductors and an electrical component of the gas turbine engine.

11. A method of producing a gas turbine engine part according to claim 1, the method including:
layering layers of the reinforcing fibers and resin for forming the composite material;
sandwiching the metallic electrical conductors between at least some successive layers of the reinforcing fibers and resin; and
consolidating the layers to form the gas turbine engine part.

12. The gas turbine engine part according to claim 1, wherein:
the composite material is a fibre reinforced polymer matrix material; and
the metallic electrical conductors are embedded by being sandwiched between successive layers of the fibre reinforced polymer matrix material.

13. The gas turbine engine part according to claim 1, wherein the metallic electrical conductors include electrically conductive wires and/or electrically conductive tracks formed in a flexible printed circuit.

14. The method of producing a gas turbine engine part according to claim 11, wherein the metallic electrical conductors include electrically conductive wires and/or electrically conductive tracks formed in a flexible printed circuit.

* * * * *